METHOD FOR FABRICATING BIPOLAR PLANAR TRANSISTOR HAVING REDUCED MINORITY CARRIER FRINGING
Original Filed Oct. 14, 1965
FIG. 1. - PRIOR ART TRANSISTOR
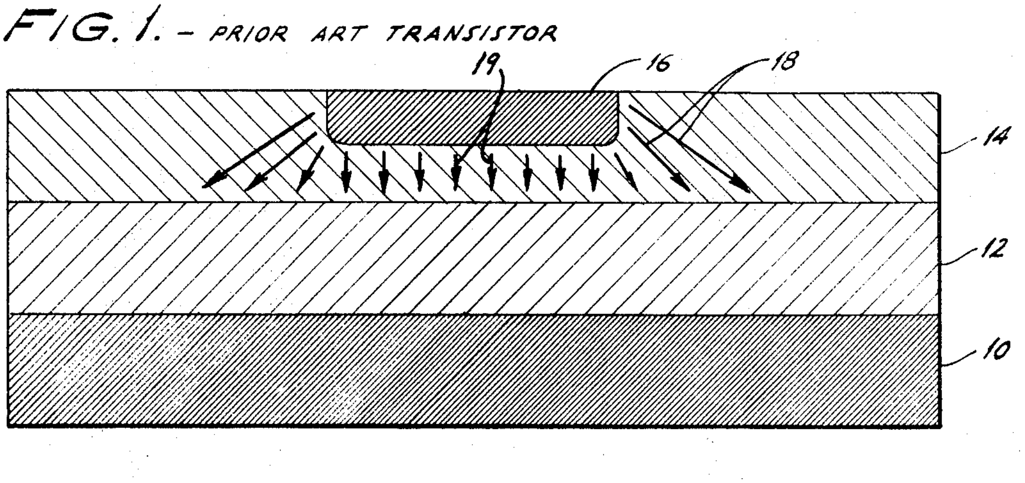
FIG. 2. - HIGH SPEED TRANSISTOR WITH SPECIAL BASE REGION
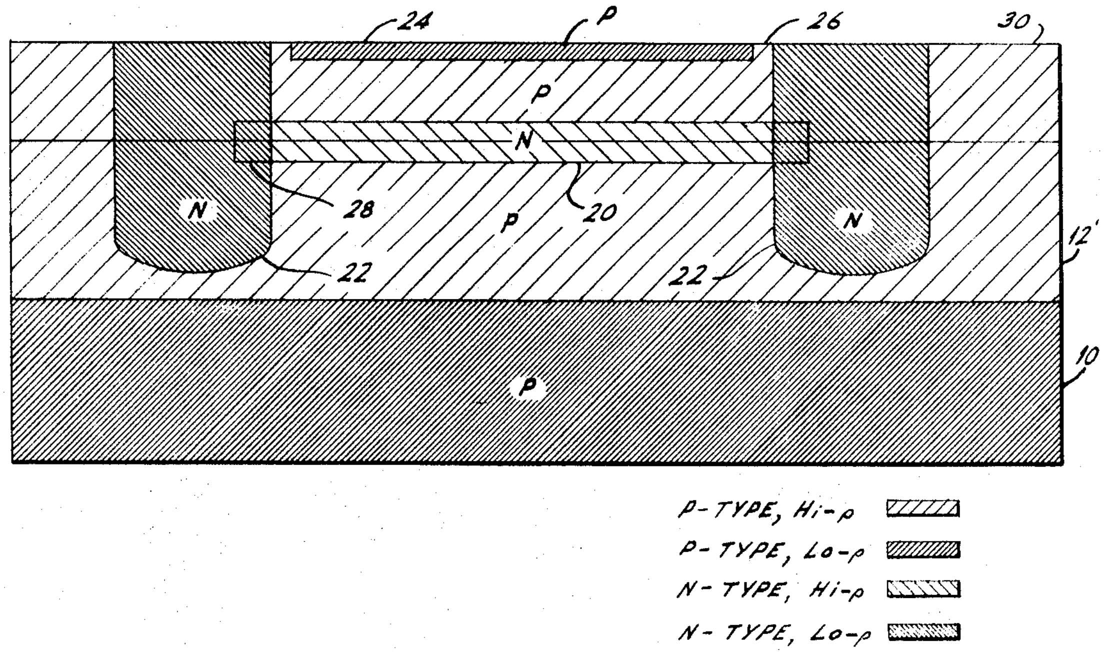
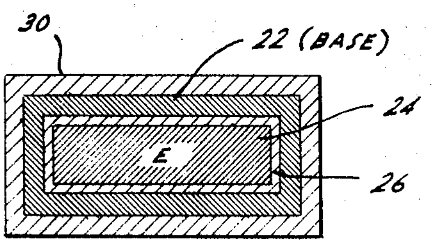
FIG. 3. - TYPICAL SURFACE TOPOGRAPHY
INVENTOR.
EARL S. SCHLEGEL
BY D R Pressman
ATTORNEY United States Patent Office 3,591,430
Patented July 6, 1971

3,591,430

METHOD FOR FABRICATING BIPOLAR PLANAR TRANSISTOR HAVING REDUCED MINORITY CARRIER FRINGING

Earl S. Schlegel, Lansdale, Pa., assignor to Philco Ford Corporation, Philadelphia, Pa.

Original application Oct. 14, 1965, Ser. No. 495,927. Divided and this application Nov. 14, 1968, Ser. No. 794,452
Int. Cl. H01l 7/36
U.S. Cl. 148—175 4 Claims

ABSTRACT OF THE DISCLOSURE

Method of fabricating a bipolar planar transistor having reduced minority carrier fringing comprising forming low-concentration, slow-diffusing and surrounding high-concentration faster-diffusing base dopant deposits on the surface of the higher-resisitivity layer of a two-layer collector-doped substrate, growing an emitter-doped epitaxial layer on the substrate, and causing the high concentration dopant deposit to diffuse vertically upward to the surface of the epitaxial layer as well as downward into the substrate, thereby to form a bipolar transistor whose base region is more heavily doped in the portion to the sides of emitter region than under the emitter region.

This is a division of application Ser. No. 495,927, filed Oct. 14, 1965 now abandoned.

This invention relates to a method of fabricating a transistor providing greatly increased high frequency response.

In the past several years, great advances have been made in the art of fabricating high frequency transistors. However, it has been noted that present high frequency transistors, in particular those of the silicon variety, fail to exhibit the high frequency characteristics predicted by theory. It is believed that the reason for this lower high frequency characteristic is because minority carriers travelling through the base region from emitter to collector fringe out into paths significantly longer than the minimum base width between the emitter and collector regions. These fringing carriers, because they travel over paths longer than the minimum base width, produce longer base transit times which obviously limit the high frequency response of the transistor. Since minority carriers travelling from emitter region to collector region tend to leave the emitter regions at the edges thereof, the fringing carriers constitute a large percentage of the carriers travelling from emitter to collector. The unequal transit times of carriers following the most direct route from emitter and collector and carriers following indirect routes produce high frequency distortion and add a significant delay to the normal response of the transistor.

The present invention relates to a method for fabricating a transistor structure which reduces this fringing effect, thereby increasing the transistor's high frequency response and decreasing distortion.

OBJECTS

Accordingly, several objects of the present invention are (1) to provide a novel and improved method for fabricating such a transistor; (2) to provide a method for fabricating a transistor having improved high frequency response and reduced distortion; (3) to provide a method for fabricating a transistor in which fringing of minority carriers travelling from emitter to collector regions is reduced. Other objects and advantages of the present invention will become apparent from a further consideration thereof.

SUMMARY

A transistor is fabricated so that the impurity concentration in the base region is increased in those portions of the base region not lying in the direct path from the emitter to the collector. Minority carriers leaving the emitter are thereby forced to travel in a more direct path from the emitter to collector.

More particularly, a body of semiconductor material of one conductivity type is epitaxially grown upon a substantially planar face of a semiconductor substrate having said one conductivity type and a first resistivity. The grown body has a resistivity higher than the first resistivity and a substantially planar surface substantially parallel to and remote from the face of the substrate. A first deposit composed of a first, fast-diffusing, dopant which, when diffused into said semiconductor material changes its conductivity type to that opposite one conductivity type, is formed over all of a portion of the planar surface enclosing and thereby isolating a given area of the planar surface from its remainder. A second, less concentrated deposit of a second, slower diffusing, dopant of the same impurity type as the first dopant is formed over the given area. A planar layer of semiconductor material of given resistivity and of said one conductivity type is epitaxially grown over the planar surface of the body. The planar layer has an exposed surface substantially parallel to the planar surface of the body. The first deposit is caused to diffuse vertically upward through the thickness of the planar layer as well as downward into the subjacent portion of the semiconductor body. The first deposit, so diffused, forms the first portion of a base layer, extending continuously from the exposed surface of the planar layer into the body and completely enclosing a given region of the exposed surface and a volume of said layer and body underlying the given region. The base portion also comprises a second portion within the layer and body, oriented substantially parallel to the given region and intersecting the first portion above its lowermost extent. The second portion has a higher resistivity than the first portion. Then a dopant of impurity type opposite that of the first and second dopants is diffused into the exposed surface of the planar layer, through an area of the given region whose boundaries are adjacent the boundaries of the given region, thereby to produce in the planar layer, within the volume enclosed by the first portion of the base region, an emitter region having boundaries adjacent those of the given region and having said one conductivity type and a resistivity lower than the given resistivity of the planar layer. In the bipolar transistor thus fabricated, the region of said body lying beneath the second portion of the base, on the side thereof remote from the exposed surface, constitutes the collector region.

DRAWINGS

FIG. 1 shows a prior art transistor,

FIG. 2 shows a cross-sectional view of a transistor fabricated by the method of the present invention.

FIG. 3 shows the surface topography of the transistor of FIG. 2.

The legend below FIG. 2 indicates the conductivity type and relative resistivity ($\rho$) of the regions of the transistors in FIGS. 1–3.

FIG. 1—PRIOR ART TRANSISTOR

The well-known prior art epitaxial transistor of FIG. 1 comprises a low resistivity (high concentration) substrate 10, an epitaxial high resistivity layer 12, an epitaxial high resistivity base region 14 of the opposite conductivity type, and a diffused low resistivity emitter region 16 of the same conductivity type as collector regions 10 and 12. The transistor of FIG. 1 is shown merely as one typical prior art transistor in which the problem of fringing of minority carriers is significant. The transistor of FIG. 1 may be formed in its own monolith as shown or may be part of a larger microcircuit monolith. To simplify the drawing, the usual contacts, passivating oxide, encapsulants, etc., are not shown. The topography of the transistor of FIG. 1 may take many different forms, with very complex emitter configurations being common.

In operation of the transistor of FIG. 1, minority carriers, illustrated by the arrows 18 and 19, travel through base region 14 from the emitter 16 to the collector region 12. In the case of a PNP transistor such as that illustrated, these minority carriers are holes; in the case of an NPN transistor the minority carriers would be electrons. Since minority carriers tend to leave the emitter at the edges thereof, many of the minority carriers will not take the shortest and most direct path from emitter to collector as illustrated at 19 but will fringe outwardly into longer paths as shown at 18. The fringing carriers 18 obviously take a longer time to travel from the emitter to the base than do carriers 19. The high frequency response of the transistor is thereby reduced and more distortion is produced than if all of the carriers travelled directly in the same manner as carriers 19.

FIGS. 2–3—HIGH SPEED TRANSISTOR

In the transistor of FIGS. 2 and 3, the problem of fringing minority carriers is largely obviated due to the special configuration of the base region. As shown in FIG. 2, the base region comprises a high resistivity portion 20 which is directly under the emitter and in the most direct path from emitter to collector, and as shown in FIGS. 2 and 3, a low resistivity portion 22 which surrounds the emitter and extends from the surface of the transistor to below the high resistivity portion 20 of the base region. The emitter region comprises a low resistivity portion 24, and a high resistivity portion 26. The low resistivity portion 24 is formed within region 26 at the surface of the transistor; region 26 corresponds in shape to region 16 of the transistor of FIG. 1. Vertical dimensions have been exaggerated in the drawing in order to show more clearly the respective positions of the various regions.

Fringing of minority carriers is reduced because of the presence of low resistivity portion 22 of the base region. Because portion 22 is heavily doped, it has a high potential energy for holes and therefore electrostatically repels holes. Therefore minority carriers (holes) leaving the edges of the low resistivity portion 24 of the emitter region will tend to go straight downwardly through the high resistivity portion 20 of the base region to reach the high resistivity portion 12′ of the collector region. After leaving portion 20 of the base region, the carriers travelling through the high resistivity portion 12′ of the collector are majority carriers and therefore do not limit the response time of the device.

METHOD OF FABRICATION

The structure shown in FIGS. 2 and 3 can be fabricated as follows: Substrate 10 may be of low resistivity P-type silicon. Layer 12′ (about 2.0–4.0 microns thick) is grown epitaxially of high resistivity (1 to 20 ohm-cm.) P-type silicon. On top of region 12′ a fast-diffusing N-type dopant such as phosphorous is deposited in the shape of the surface area of region 22 as indicated in FIG. 3. Such a deposit can be formed utilizing well known photolithographic oxide masking techniques. The surface density of the deposit should be about $10^{21}$ atoms/cc. and the diffusion depth should be about 1 micron. A deposit for region 20 is next formed by providing a slow diffusing N-type dopant (such as antimony) over the area bounded by region 22 and overlapping region 22 somewhat as shown at 28 in FIG. 2. This diffusion would be more shallow (about $3\times10^{-2}$ microns) with a lower surface concentration (about $10^{18}$ atoms/cc.).

Region 30 (about 0.6–0.8 micron thick) is then grown epitaxially over region 12′ and the deposits for regions 20 and 22. Region 30 should be of P-type silicon with a resistivity of 5 to 20 ohm-cm. Next the transistor is subjected to heat to cause region 22 to diffuse upwardly through region 30 to the surface thereof, thereby isolating the emitter region 26 from the rest of region 30. At the same time, region 22 will also diffuse downwardly as indicated.

Lastly, region 24 may be formed within region 26 by diffusing boron (a P-type dopant) about 0.3 micron deep with a surface density of $4\times10^{20}$ atoms/cc. The lower surface of region 24 is parallel to the upper surface of region 20.

An advantage of the present technique is that the width of region 20 is determined by one shallow diffusion of region 20 itself rather than by the difference between a thick diffusion of region 16 and an epitaxial layer 14 as in FIG. 1. This gives a more accurate control over base width, thereby providing more uniform and predictable devices.

While the emitter is shown as composed of a high concentration portion 24 and a lower concentration portion 26, it will be understood that alternatively the emitter can be formed by diffusing region 24 down to the top of region 20 so that it occupies the entire thickness which region 26 presently occupies. However in such a structure the emitter diffusion would affect base width, which is less desirable than the structure shown in the drawing. Also the area of region 24 may optionally be increased so that it meets region 22.

Although the emitter has an oblong shape in FIG. 3, it will be understood that the emitter can take many shapes far more complex than indicated. To provide maximum injection efficiency emitters are usually fabricated to have the maximum possible edge dimension since carriers tend to leave the emitter from the edges thereof.

The shape of base region 22 should be designed to surround the emitter region. It will be noted that the upper surface of region 22, which lies in the same plane as the surface of the wafer, has low resistivity. Thus small area contacts to the base region will be adequate. whereas in the transistor of FIG. 1, due to the high resistivity of region 14, large area contacts are necessary.

The transistor fabricated according to the invention can be formed as part of a microcircuit monolith rather than an individual transistor, and, as stated, the emitter can have any shape desired. Similarly, the invention is not limited to a method for fabricating a PNP device, but may as well comprise a method for fabricating an NPN device.

While there has been described what is at present considered to be the preferred embodiment of the invention, it will be apparent that various modifications and other embodiments thereof will occur to those skilled in the art within the scope of the invention. Accordingly, it is desired that the scope of the invention be indicated by the appended claims only.

I claim:

1. A method of fabricating a bipolar planar transistor, comprising the following steps:

(a) epitaxially growing, upon a substantially planar face of a semiconductor substrate having a first resistivity and one conductivity type, a body of semiconductor material of said one conductivity type, said body having a resistivity higher than said first resistivity and a substantially planar surface substantially parallel to and remote from said face of said substrate, (b) forming over all of a portion of said surface surrounding a given area of said surface and isolating said given area from the remainder of said surface a first deposit of a first dopant which when diffused into said semiconductor material changes its conductivity type to a type opposite said one type, said first dopant having a given concentration in said first deposit and a given diffusion rate, (c) forming over at least said given area a second deposit of a second dopant which when diffused into said semiconductor material changes its conductivity type to said opposite type, said second dopant having a concentration in said second deposit lower than said given concentration and a diffusion rate lower than said given diffusion rate, (d) epitaxially growing a planar layer of semiconductor material of said one conductivity type and a given resistivity over said surface of said body, said planar layer having an exposed surface remote from and substantially parallel to said surface of said body, (e) causing said first deposit to diffuse upward through the thickness of said layer to said exposed surface and also to diffuse downward to a level beneath that of the layer formed by diffusion of said second deposit, thereby to form a base region of said opposite conductivity type, comprising a first portion extending continuously from said exposed surface through said layer and into said body and completely enclosing a given region of said exposed surface and a volume of said layer and body underlying said given region, and also comprising a second portion within said layer and body, oriented substantially parallel to said given region and intersecting said first portion above its lowermost extent, said second portion having a higher resistivity than said first portion, and (f) diffusing into said exposed surface of said planar layer, through an area of said given region all of whose boundaries are adjacent the boundaries of said given region, a dopant of impurity type opposite that of said first and second dopants, thereby to produce in said planar layer, within said volume enclosed by said first portion of said base region, an emitter region having boundaries adjacent those of said given region and having said one conductivity type and a resistivity lower than said given resistivity of said layer, the region of said body lying beneath said second portion of said base, on the side thereof remote from said given region of said exposed surface, constituting the collector region of said bipolar transistor.

2. A method according to claim 1, wherein, in performing step (f), said dopant of said opposite impurity type is diffused into said exposed surface through an area of said given region whose boundaries are spaced from although adjacent said boundaries of said given region.

3. A method according to claim 1, wherein, in performing step (f), said dopant of said opposite impurity type is diffused into said layer only part of the distance between said exposed surface of said layer and the nearest opposing surface of said second portion of said base region.

4. A method according to claim 3, wherein, in performing step (f), said dopant of said opposite impurity type is diffused into said exposed surface through an area of said given region whose boundaries are spaced from although adjacent said boundaries of said given region.

References Cited

UNITED STATES PATENTS

| | | | |
|---|---|---|---|
| 3,244,950 | 4/1966 | Ferguson | 148—175 |
| 3,293,087 | 12/1966 | Porter | 148—191 |

RICHARD O. DEAN, Primary Examiner

U.S. Cl. X.R.

148—33.5, 188, 191